United States Patent [19]
Bergstrom

[11] Patent Number: 5,087,885
[45] Date of Patent: Feb. 11, 1992

[54] LIGHTING ARRESTER TESTER

[75] Inventor: Russell N. Bergstrom, Loveland, Colo.

[73] Assignee: Electron Instruments, Loveland, Colo.

[21] Appl. No.: 509,154

[22] Filed: Apr. 16, 1990

[51] Int. Cl.$^5$ .................. G01R 31/00; G01R 31/12
[52] U.S. Cl. .................. 324/547; 324/546; 324/551; 324/553; 361/40
[58] Field of Search ............ 324/361, 549, 551, 552, 324/546, 547; 361/39, 40

[56] References Cited

U.S. PATENT DOCUMENTS

| | | | |
|---|---|---|---|
| 3,443,223 | 5/1969 | Kennon | 324/72 |
| 3,789,294 | 1/1974 | Nitta et al. | 324/54 |
| 3,846,698 | 12/1974 | Lawton | 324/51 |
| 4,117,397 | 9/1978 | Fukao et al. | 324/551 |
| 4,266,184 | 5/1981 | Devine | 324/54 |
| 4,577,148 | 3/1986 | Sweetana | 324/72 |
| 4,621,298 | 11/1986 | McMillen | 361/38 |
| 4,757,263 | 7/1988 | Cummings et al. | 324/552 |
| 4,803,436 | 2/1989 | Kresge et al. | 324/549 |

Primary Examiner—Kenneth A. Wieder
Assistant Examiner—Glenn W. Brown
Attorney, Agent, or Firm—Shlesinger, Arkwright & Garvey

[57] ABSTRACT

A portable tester is disclosed for determining in the field the condition of a lightning arrester connected in parallel with a high voltage winding of a transformer. The tester comprises a battery; an inverter connected to the battery for generating an AC output; at least one transformer and a rectifier for transforming the output of the inverter to a high voltage DC having a magnitude greater than the breakdown voltage of a lightning arrester connected in paralled to the high voltage winding of a transformer being tested; at least one capacitor connected across the rectifier for being charged to the high voltage DC; an overvoltage spark gap switch for discharging the high voltage charge of the capacitor across the high voltage winding of the transformer being tested; and a storage oscilloscope for detecting the response of the winding to the high voltage pulse. A normally functioning lightning arrester will clamp the voltage across the transformer winding at the arrester's known breakdown point.

32 Claims, 3 Drawing Sheets

LIGHTING ARRESTER TESTER

FIELD OF THE INVENTION

The present invention relates generally to a portable, self-contained tester for determining in the field the condition of a lightning arrester connected across the primary winding of a distribution transformer and particularly to a tester for determining the condition of a gapless metal-oxide varistor arrester disposed under oil in the transformer.

BACKGROUND OF THE INVENTION

With the development of a gapless metal-oxide varistor lightning arrester, it has become common to locate an arrester of this type under oil within a transformer tank across the high voltage winding of a transformer to afford an enhanced voltage surge protection. Typically, the arrester is designed such that in the event of a failure, its housing will fracture for short circuit available currents, causing internal elements to be ejected. This action removes the arrester from the transformer circuit, leaving the transformer unprotected but usable in an emergency.

Since the arrester is located under oil in the transformer tank, visual or electrical evaluation is extremely difficult. Also, since the arrester is in parallel with the high voltage winding, the more common types of tests are of no value.

Known lightning arrester testers are stationary, laboratory based equipment, requiring highly skilled and technical people to operate. A method and apparatus for determining the condition of a gapless metal-oxide varistor arrester is disclosed in U.S. Pat. No. 4,803,436. However, the test procedure disclosed appears complicated, requiring skilled and technical personnel for its use, operation and interpretation of the test results. Also, the inherent current losses that a transformer exhibits at the frequency used in the Kresge apparatus are quite high. Thus, a great deal of energy must be expended to overcome these losses. This limits the range of testing capability of the Kresge apparatus. Further, the high current discharge capacitors used in the Kresge apparatus can be destructive.

OBJECTS AND SUMMARY OF THE INVENTION

It is therefore an object of the present invention to provide a tester for determining the condition of a gapless metal-oxide varistor arrester that is disposed under oil in a transformer tank or any exposed lightning arrester.

It is another object of the present invention to provide a tester that is relatively easy to operate even for semi-skilled personnel for determining the condition of a lightning arrester, particularly a gapless metal-oxide varistor, that is connected across the high voltage winding of a transformer.

It is still another object of the present invention to provide a tester that is portable, compact and self-contained, thereby making it relatively easy to carry the tester to the field where it is used for determining the condition of a lightning arrester, particularly a gapless metal-oxide varistor arrester.

It is yet another object of the present invention to provide a tester that has its own high voltage power supply for generating a high voltage pulse that is below the breakdown voltage level of the transformer being tested and above the breakdown level of an arrester connected to the transformer.

It is a further object of the present invention to provide a tester that uses a battery for generating a high voltage pulse.

It is an object of the present invention to provide a tester that is connected directly across the primary winding of a transformer being tested for determining the condition of a lightning arrester, particularly a gapless metal-oxide varistor arrester, that is connected across the primary winding of the transformer.

It is another object of the present invention to provide a tester that utilizes the characteristic response of a transformer winding to a high voltage pulse for determining the condition of a lightning arrester, particularly a gapless metal-oxide varistor arrester disposed under oil in the transformer tank that is connected across the primary winding of the transformer.

It is an object of the present invention to provide a portable tester that can easily be transported from site to site for testing various electrical equipment that requires the generation of a high voltage pulse in their test procedures.

It is another object of the present invention to provide a tester that can use the battery normally found in a vehicle.

It is yet another object of the present invention to provide a tester that is completely isolated from earth ground, thereby providing a relatively safe device for a user.

It is another object of the present invention to provide a tester that has its high voltage components immersed in insulating liquid and separated from its low voltage components.

It is an object of the present invention to provide a tester that uses a spark gap switch for a controlled and safe discharge of a high voltage pulse across the primary winding of the transformer being tested.

It is another object of the present invention to provide a tester that eliminates the inherent high current losses exhibited by a transformer being tested when a voltage pulse is discharged at the secondary winding of the transformer.

It is still another object of the present invention to provide a tester that eliminates the use of high current discharge capacitors that can be destructive.

It is yet another object of the present invention to provide a tester that can be used for a wide range of equipment size for determining the condition of a lightning arrester that is connected in parallel with the high voltage winding of a transformer.

In summary, the present invention provides a tester that is portable, self-contained, relatively safe and easy to use in the field for determining the condition of an arrester, particularly a gapless metal-oxide varistor arrester disposed under oil in a transformer tank.

These and other objects of the present invention will become apparent from the following detailed description.

DETAILED DESCRIPTION OF THE INVENTION

FIG. 1

Figure 1:
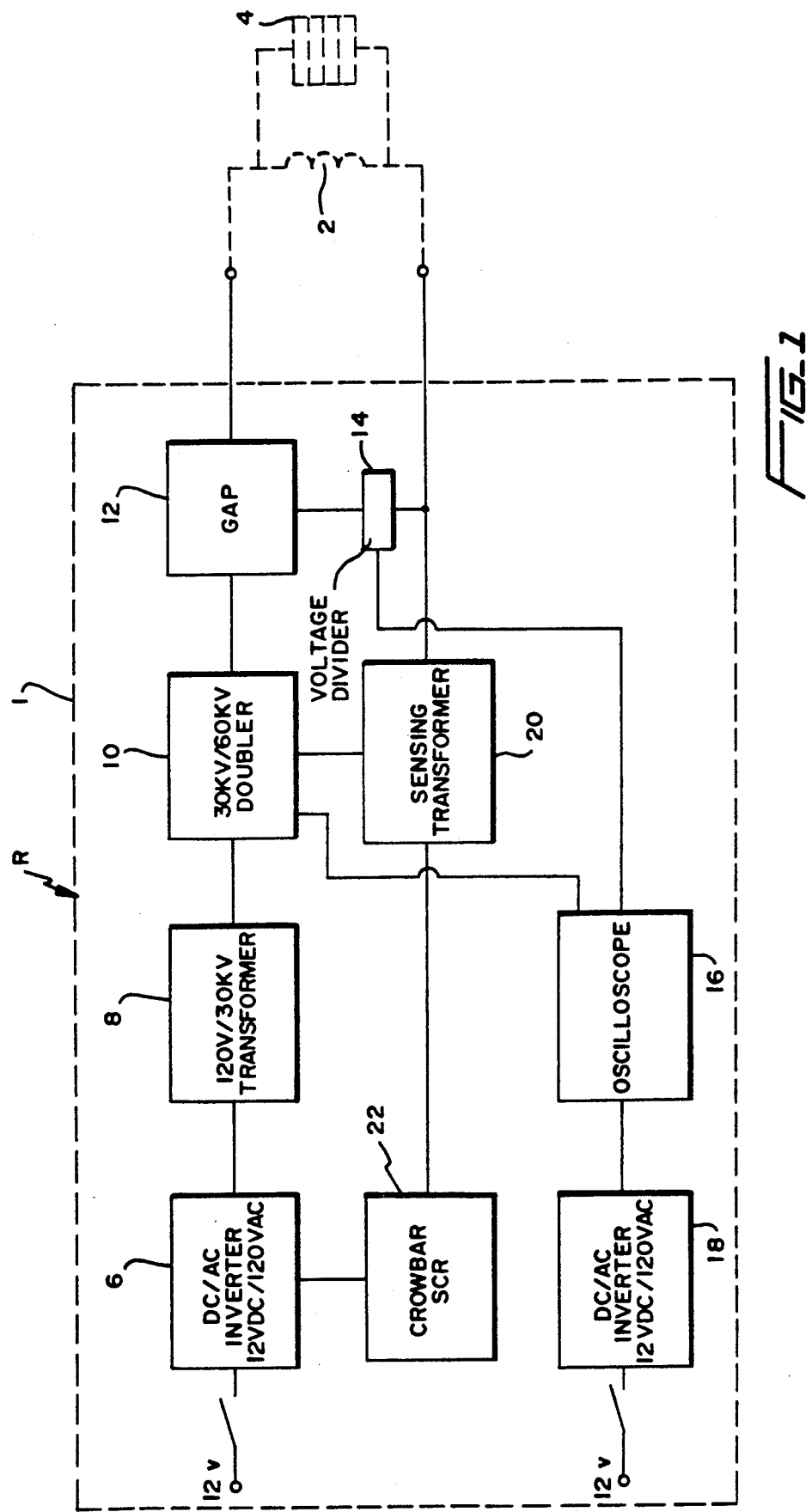
FIG. 1 is a functional block diagram of a tester according to the present invention, with portions shown in dashed lines, showing the tester connected across a primary winding of a transformer with a gapless metal-oxide varistor arrester connected thereto.

A portable, self-contained battery powered arrester tester R is disclosed in FIG. 1 shown in dashed lines. To provide isolation to surrounding equipment and operator safety, the entire components of the tester R are preferably enclosed in an ABS plastic carrying case 1. This advantageously provides a measure of safety for a user who might accidentally touch one of the output leads of the tester. Even if there is residual charge in the tester R, the user will not form a conductive path to ground, since there is no connection from the tester R to earth ground.

The tester R is shown connected across a primary or high voltage winding 2 of a transformer with a gapless metal-oxide varistor arrester 4. A person skilled in the art will understand that the tester R can just as well be used for testing any type of lightning arrester or other electrical equipment that depends on the generation of a high voltage pulse in its test procedure.

The tester R includes a high voltage power source comprising an inverter 6, a step-up transformer 8, and a voltage doubler 10. The inverter 6 connects to a DC power source, preferably 12 volts, and transforms it to 120 volt AC. The transformer 8 takes the 120V AC output of the invertor 6 and steps it up to 30 kV. The voltage doubler 10 further raises the 30 kV output of the transformer 8 to 60 kV DC.

An overvoltage spark gap switch 12 connects to the 60 kV output of the voltage doubler 10. A voltage divider 14 connects to the spark gap switch 12 and acts as a load bank and to maintain conduction across the spark gap switch 12.

A storage oscilloscope 16 records the response of the transformer winding 2 to the high voltage pulse generated by the tester R. The oscilloscope 16 takes its input from a voltage divider in the voltage doubler 10. The oscilloscope 16 is triggered by the voltage divider 14.

An inverter 18 provides a separate power source for the storage oscilloscope 16. Typical storage oscilloscopes commonly use digital electronics which are highly susceptible to steep fronted voltages. For this reason, a power supply separate from the high voltage power generation is used for the oscilloscope to minimize the ground rise on the display scope.

A sensing transformer 20 connected to the voltage doubler 10 senses the discharge of a high voltage pulse and triggers a crowbar silicon controlled rectifier circuit 22 associated with the inverter 6 to prevent recharge or refire of the tester R after discharge of a high voltage pulse.

FIG. 2

A battery 24 provides the input power to the inverter 6. Since most vehicles include a 12 volt battery, it is preferable to have the battery 24 at 12 volts so that the battery of a vehicle can be used if the battery of the inverter 6 fails while being used in the field. A circuit breaker 26 is connected in series with the battery 24 to protect the electrical components of the inverter 6. A power switch 28 connected in series with the battery 24 controls the power input to the inverter 6. The switch 28 is preferably electrically held in the on position so that when the holding voltage goes low, as when the battery voltage goes low, the switch 28 is automatically opened.

Figure 2:
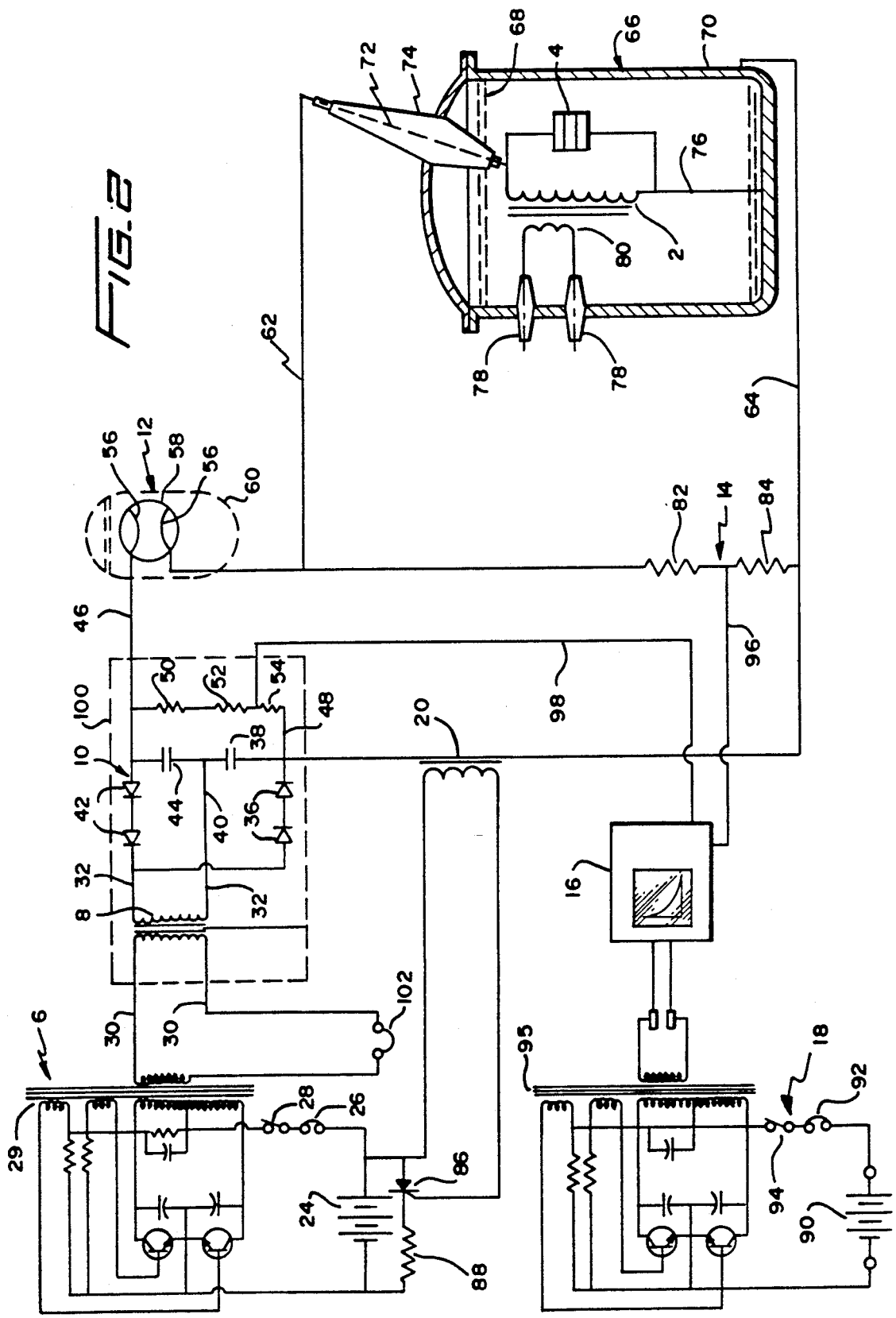
FIG. 2 is a schematic wiring diagram of the tester of FIG. 1, shown connected across a primary winding of a transformer with a gapless metal-oxide varistor arrester disposed under oil in a transformer tank shown in cross-section.

A person skilled in the art will understand the operation of the inverter 6 from the schematic diagram shown in FIG. 2. The inventor 6 converts the 12 volt DC power of the battery 24 to AC. A transformer 29 steps up the AC power to 120V AC at output leads 30. The transformer 8 raises the 120 volt AC output of the inverter 6 to 30 kV AC at output leads 32. The high voltage transformer 8 is preferably separate from the low voltage transformer 29 because high voltage transformers require additional requirements for safety, such as increased insulation level, short circuit withstand, etc. that low voltage transformers do not need.

The voltage doubler 10 connected to the transformer 8 further raises and converts the 30 kV AC power to 60V DC. The 60 kV output is advantageously below the breakdown voltage level of most distribution transformers and above the breakdown voltage of the arrester 4. The choice of 60 kV makes the tester R applicable to a wide range of size of equipment. Diodes 36 permit the positive half cycle of the 30 kV AC power to charge capacitor 38 to +30 kV relative to reference 40. Diodes 42 permit the negative half cycle of the 30 kV AC power to charge the capacitor 44 to −30 kV relative to the reference 40. The diodes 36 prevent the capacitor 38 from discharging when the AC power swings negative. When the voltages across the capacitors 38 and 44 are added, a voltage having a magnitude of 60 kV DC is apparent at lead 46 relative to reference 48.

Load resistors 50, 52 and 54 are connected in series between leads 46 and the reference 48. Load resistors 52 and 54 form a voltage divider for input to the oscilloscope 16. The resistors 52 and 54 are preferably in 1000 to 1 ratio.

The 60 kV DC output of the voltage doubler 10 connects to the overvoltage spark gap switch 12 which is used as a high voltage switch to discharge the capacitors 38 and 44. Thus, 60 kV is impressed across the electrodes 56. The spark gap switch 12 is preset to break over at 60 kV. The spark gap switch starts to conduct at 60 kV and continues to conduct until the voltage is down to about 1800 volts. The spark gap switch 12 includes a pair of refractory metal electrodes 56 spaced apart from each other and hermetically sealed under gas pressure in a high-alumina ceramic tube 58. The gas helps prevent deterioration of the electrodes 56. The tube 58 is immersed in a dielectric oil in a housing 60.

The spark gap switch 12 is typically characterized by breakdown voltages from as low as 1 kV to over 100 kV, peak current capabilities as high as 50 kA, and an arc resistance that is typically 10–20 milliohms or less. Typical discharge current pulse widths are 10 microseconds or less. The spark gap switch 12 is custom made by EG&E Electronic Components, Boston, Mass.

The spark gap switch 12 acts as a perfect switch having infinite resistance when open, zero voltage drop across it when closed, no prefire breakdown and no lingering current when opened. This permits the lightning arrester 4 to be pulsed while connected to the transformer winding 2. When the capacitors 44 and 38 reach 60 KV across them, the spark gap switch goes in to full conduction. The rise time of the wave front is approximately 1 KV per micro-second. This means the total capacitive charge is released in 60 millionths of a second.

A common analogy of the transformer winding and the rapid wave front is much like that of velocity and water. If one slowly places his hand into the water, there appears to be little or no resistance to this action. If, however, the speed of the hand is increased, the resistance to the motion increases. If one slaps the water with the palm, a great deal of resistance is encountered. This same phenomenon occures when a rapid rise of current is presented to the transformer winding. The winding appears to the wave front as a high resistance. This allows the metal oxide varistor arrester to turn on and shunt the surge spike to ground.

Output lead lines 62 and 64 are connected to the high voltage winding 2 of a distribution transformer 66 to be tested.

The transformer 66 is a distribution type transformer, typically between 10 kVA to 50 kVA in size. The transformer 66 typically has a breakdown level of 120 kV. Thus, the 60 kV pulse impressed by the tester R on the transformer is well below its breakdown level, but above the breakdown voltage of the arrester 4, which is typically in a range from 3 kV to 27 kV RMS. A dielectric oil 68 immerses the windings of the transformer within the transformer casing 70 to provide an insulating medium for the windings.

The gapless metal oxide varistor arrester 4, connected across the primary winding 2, is completely immersed in the dielectric oil 68 within the transformer casing 70.

One winding terminal 72 of the transformer 66 is brought out from the transformer casing 70 through a high voltage bushing 74. The other winding terminal 76 is connected to the transformer casing 70. Connection means for low voltage winding 80 are made through low voltage bushings 78.

The voltage divider 14 includes resistors 82 and 84 that are preferably in 1000 to 1 ratio.

The sensing transformer 20, operably associated with the lead 64, is designed to pick up a pulse response from the transformer 66 when the 60 kV pulse is discharged across the winding 2. The sensing transformer 20 triggers a silicon controlled rectifier (SCR) 86, used as a crowbar. The SCR 86 is normally in the open position in a circuit comprising a series connected resistor 88 and the battery 24. The SCR 86 closes when triggered, drawing down the battery voltage through the resitor 88 to thereby prevent recharge of the high voltage power supply. This action also causes the switch 28 to open, thereby isolating the battery 24 from the inverter 6.

The inverter 18 is similar to the inverter 6. A battery 90, preferably at 12 volts DC, provides the power source to the inverter 18. Circuit breaker 92 protects the components of the inverter 18 from overcurrent and short circuit. A power switch 94 controls the battery power flow to the inverter 18. A step up transformer 95 raises the output of the inverter 18 to 120 volts AC.

Output from the voltage divider 14 is connected by lead line 96 to the storage oscilloscope 16 to provide a trigger means to the oscilloscope. The response of the high voltage winding 2 to the high voltage pulse generated by the tester R is picked up by the oscilloscope through lead line 98 which is connected to the voltage divider comprised of the resistors 52 and 54. A camera (not shown) may be connected to the oscilloscope 16 to provide a permanent record of the response. The lead line 98 is preferably a high frequency compensated shielded cable.

All high voltage components such as the transformer 8 and the doubler 10 are preferably immersed in silicon transformer liquid in a housing 100, shown in dashed lines. The high dielectric stand-off and non-contaminating, non-caustic properties of this material make it ideal for this application.

OPERATION

The output leads 62 and 64 of the tester R are connected across the high voltage winding 2 of the transformer 66, rated at 15 kVA, through the high voltage bushing 74 and the transformer casing 70. A firing switch 102 causes the battery 24 to charge the capacitors 38 and 44 to a total voltage magnitude of 60 kV DC through a series of voltage transformations. Since the capacitors are parallel to the spark gap switch 60, the same 60 kV is impressed across the electrodes 56 of the spark gap switch 60. The spark gap switch 60 is preset to start to conduct at 60 kV, discharging the capacitors 38 and 44 in a high voltage pulse across the spark gap switch and across the voltage winding 2, until the voltage goes down to about 1800V. Once conduction occurs across the electrodes 56, a 60 kV pulse whose rise time approaches 1 kV per microsecond is impressed across the winding 2 and the arrester 4. The current initially conducts through resistors 82 and 84 before it is diverted through the arrester 4.

Figure 4:
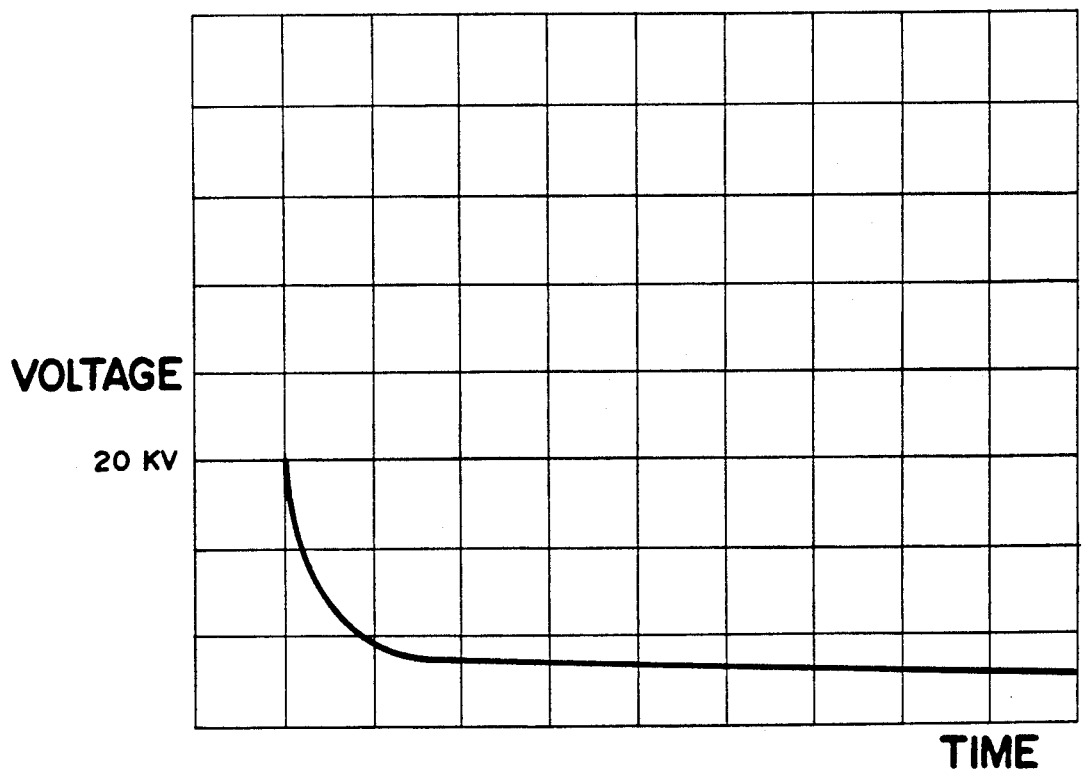
FIG. 4 is an oscillograph of a response to a high voltage pulse of a primary winding of a transformer with a properly functioning gapless metal-oxide varistor arrester connected thereto.

If the arrester 4 functions properly, the voltage rise at the high voltage winding 2 is limited to the arrester's known breakdown level. The arrester 4 clamps the voltage surge to its breakdown level and diverts the pulse to ground. The arrester 4 used with a 15 kVA transformer should have a breakdown level of 20 kV. Thus, the high voltage winding 2 receives only a peak of 20 kV, as best shown in FIG. 4. The peak is the important aspect shown in FIG. 4. The peak represents the crest voltage reached on the transformer winding.

Figure 3:
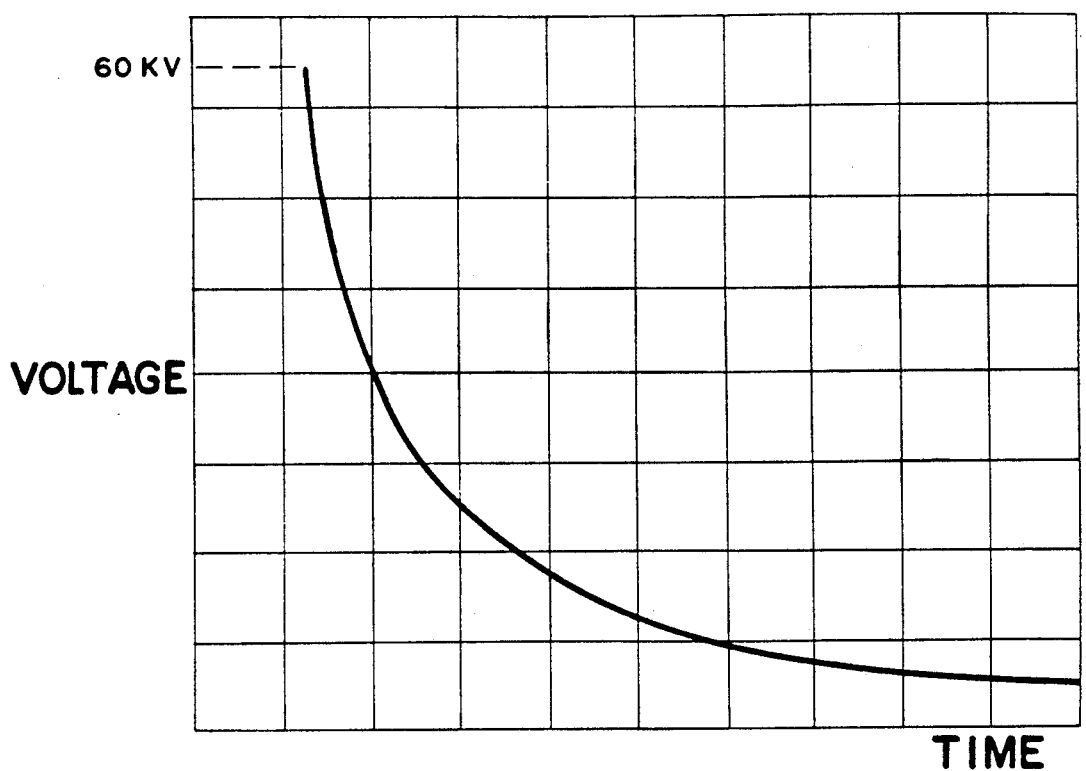
FIG. 3 is an oscillograph of a response to a high voltage pulse of a primary winding of a transformer without arrester action.

If the arrestor 4 is faulty, no arrester action will be provided and the high voltage winding 2 will see the entire 60 kV pulse generated by the tester R, as best shown in FIG. 3.

The response of the transformer winding 2 to the high voltage pulse is much the same as a capacitor. That is, the winding charges to the breakdown point of the arrester 4. Any further voltage rise is clamped to this level. The inductance of the high voltage winding 2 produces a counter electromotive force to the rapid changing current from the high voltage power supply. Thus, the windings 2 of the transformer discharges at a relatively slow rate, causing a damped decay back to zero voltage. Dissipation of the transformer winding capacitance, and the remaining energy stored in the capacitors 38 and 44 are displayed as a critically-clamped voltage decay, as best shown in FIG. 4.

Winding characteristics of the high voltage winding 2 have little effect on the clamping point of the metal-oxide arrester 4, but will cause voltage decay time to vary. When discharged into a variety of winding configurations, average total pulse width was 0.5 millisecond. It is known that the turn over of the metal-oxide arrester 4 from a capacitive behavior to a resistive behavior takes sometime; therefore, a voltage spike (or overshoot, not shown) can be observed in the measurement of the residual voltage.

Once the sensing transformer 20 detects that a pulse has passed through the transformer 66, it fires the SCR 86, causing the SCR to conduct through the load resistor 88, thereby lowering the voltage of the battery 24 relative to the inverter 6. This keeps the tester R from recharging or refiring. Also, the SCR 86 causes the switch 28 to open due to the reduced voltage in the switch circuit, thereby isolating the battery 24 from the inverter 6.

The response of the high voltage winding 2 to the 60 kV pulse is recorded in the storage oscilloscope 16.

Although the tester R is disclosed for testing a gapless metal-oxide varistor arrester, a person skilled in the art will understand that the tester R is also applicable for testing any spark gap lightning arrester. Also, the tester R is applicable for testing other electrical equipment, such as insulation testing, etc. that requires the generation of a high voltage pulse in the test procedure.

While this invention has been described as having preferred design, it is understood that it is capable of further modification, uses and/or adaptations of the invention following in general the principle of the invention and including such departures from the present disclosure as come within known or customary practice in the art to which the invention pertains, and as may be applied to the essential features set forth, and fall within the scope of the invention or the limits of the appended claims.

I claim:

1. A tester for determining the condition of a lightning arrester connected in parallel with a high voltage winding of a transformer, said tester comprising:
   a) a power source;
   b) means for transforming the output of said power source to a high voltage having a magnitude greater than the breakdown voltage rating of a lightning arrester connected in parallel to the high voltage winding of a transformer being tested;
   c) means for generating a high voltage pulse from the output of said transforming means and discharging the high voltage pulse across the high voltage winding of the transformer;
   d) said generating and discharging means including a spark gap switch means connected to the output of said transforming means and connected across the high voltage winding of the transformer being tested;
   e) means for detecting the response of the winding to the high voltage pulse;
   f) whereby a normally functioning arrester will clamp the impressed high voltage pulse across the transformer winding at the arrester's known breakdown level.

2. A tester as in claim 1, wherein:
   a) said power source includes a first battery.

3. A tester as in claim 2, wherein:
   a) said transforming means includes a first inverter connected to said first battery.

4. A tester as in claim 3, wherein:
   a) said transforming means includes a first transformer for raising the voltage output of said first inverter.

5. A tester as in claim 4, wherein:
   a) said transforming means includes a second transformer connected to said first transformer for raising the voltage output of said first transformer.

6. A tester as in claim 5, wherein:
   a) said transforming means includes a rectifier connected to said second transformer.

7. A tester as in claim 6, wherein:
   a) said rectifier is a voltage doubler.

8. A tester as in claim 1, and further comprising:
   a) means for preventing said generating and discharging means from operating after the high voltage pulse has been discharged.

9. A tester as in claim 8, wherein:
   a) said preventing means includes means for automatically isolating said power source from said transforming means after a high voltage pulse has been discharged.

10. A tester as in claim 9, wherein:
    a) said isolating means includes an electrically-held switch; and
    b) means for drawing down the voltage of said power source after the high voltage pulse has been discharged, thereby causing said electrically-held switch to trip open.

11. A tester as in claim 10, wherein:
    a) said drawing means includes a sensing transformer for detecting the discharge of the high voltage pulse;
    b) a crowbar silicon controlled rectifier triggered by said sensing transformer; and
    c) a load resistor connected in series with said power source and said silicon controlled rectifier to thereby form a circuit that is turned on when said silicon controlled rectifier is triggered.

12. A tester as in claim 1, wherein:
    a) said generating and discharging means includes at least one capacitor.

13. A tester as in claim 12, wherein:
    a) said spark gap switch means is connected across said at least one capacitor.

14. A tester as in claim 1, wherein:
    a) said detecting means includes an oscilloscope operably connected to said generating and discharging means.

15. A tester as in claim 14, wherein:
    a) said generating and discharging means includes a voltage divider; and
    b) said oscilloscope is operably connected to said voltage divider.

16. A tester as in claim 14, and further comprising:
    a) a separate power source for said oscilloscope.

17. A tester as in claim 16, wherein:
    a) said separate power source includes a second battery; and
    b) said separate power source includes a second inverter connected to said second battery.

18. A portable tester for determining in the field the condition of a lightning arrester connected in parallel with a high voltage winding of a transformer, said tester comprising:
    a) a battery;
    b) an inverter being connected to said battery for generating an AC output;

c) means for transforming the output of said inverter to a high voltage DC having a magnitude greater than the breakdown voltage rating of a lightning arrester connected in parallel to the high voltage winding of a transformer being tested;

d) at least one capacitor being connected across said transforming means for being charged to the high voltage DC;

e) means for discharging the high voltage charge of said at least one capacitor across the high voltage winding of the transformer being tested;

f) said discharging means including an overvoltage spark gap switch connected across said at least one capacitor;

g) means for detecting the response of the winding to the high voltage pulse;

h) whereby a normally functioning lightning arrester will clamp the voltage across the transformer winding at the arrester's known breakdown level.

19. A tester as in claim 18, wherein:

a) said transforming means includes at least one transformer for raising the output voltage of said inverter.

20. A tester as in claim 19, wherein:

a) said transforming means includes a voltage doubler connected to said at least one transformer for charging said at least one capacitor to twice the voltage of said at least one transformer.

21. A tester as in claim 18, wherein:

a) said detecting means includes an oscilloscope.

22. A tester as in claim 21, wherein:

a) said oscilloscope includes a separate power source.

23. A tester as in claim 18, and further comprising:

a) means for for automatically isolating said battery from said inverter after a high voltage pulse has been discharged, thereby preventing recharge of said at least one capacitor.

24. A tester as in claim 23, wherein:

a) said isolating means includes a crowbar silicon controlled rectifier.

25. A device for generating and discharging a high voltage pulse across an electrical equipment being tested in the field, said device comprising:

a) a battery;

b) an inverter connected to said battery;

c) at least one transformer being connected to said inverter for raising the voltage output of said inverter;

d) a rectifier being connected to said at least one transformer;

e) at least one capacitor being connected across said rectifier;

f) spark gap switch means being connected across said at least one capacitor for discharging said at least one capacitor across the electrical equipment to be tested;

g) means for connecting the output of said switch means to the equipment to be tested; and h) means for automatically isolating said battery from said inverter after a high voltage pulse has been discharged, thereby preventing recharge of said at least one capacitor.

26. A device as in claim 25, and further comprising:

a) another transformer connected in series with said at least one transformer.

27. A device as in claim 25, wherein:

a) said rectifier is a voltage doubler.

28. A device as in claim 25, and further comprising:

a) means for detecting the response of the equipment being tested to the high voltage pulse.

29. A device as in claim 28, wherein:

a) said detecting means includes a storage oscilloscope.

30. A device as in claim 25, wherein:

a) said isolating means includes an electrically-held switch; and b) means for drawing down the voltage of said battery after the high voltage pulse has been discharged, thereby causing said electrically-held switch to trip open and preventing recharging of said at least one capacitor.

31. A device as in claim 30, wherein:

a) said isolating means includes a crowbar silicon controlled rectifier.

32. A tester for determining the condition of a lightning arrester connected in parallel with a high voltage winding of a transformer, said tester comprising:

a) a low voltage power source;

b) means for transforming the output of said power source to a high voltage having a magnitude greater than the breakdown voltage rating of a lightning arrester connected in parallel to the high voltage winding of a transformer being tested;

c) means for generating a high voltage pulse from the output of said transforming means and discharging the high voltage pulse directly across the high voltage winding of the transformer;

d) means for detecting the response of the winding to the high voltage pulse; and e) means for automatically isolating said power source from said transforming means after a high voltage pulse has been discharged, thereby preventing said generating and discharging means from operating after the high voltage pulse has been discharged.

* * * * *